US010104320B2

United States Patent
Itano et al.

(10) Patent No.: US 10,104,320 B2
(45) Date of Patent: *Oct. 16, 2018

(54) SOLID-STATE IMAGE PICKUP DEVICE WITH SIGNAL PROCESSING AND LEVEL SHIFTING

(71) Applicant: CANON KABUSHIKI KAISHA, Tokyo (JP)

(72) Inventors: Tetsuya Itano, Sagamihara (JP); Kazuo Yamazaki, Yokohama (JP); Nobuyuki Endo, Fujisawa (JP); Kyouhei Watanabe, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/098,117

(22) Filed: Apr. 13, 2016

(65) Prior Publication Data

US 2016/0309101 A1  Oct. 20, 2016

Related U.S. Application Data

(63) Continuation of application No. 13/512,281, filed as application No. PCT/JP2010/006944 on Nov. 29, 2010, now Pat. No. 9,338,377.

(30) Foreign Application Priority Data

Dec. 2, 2009 (JP) ................................ 2009-274964

(51) Int. Cl.
*H04N 5/361* (2011.01)
*H01L 27/146* (2006.01)
(Continued)

(52) U.S. Cl.
CPC ....... *H04N 5/361* (2013.01); *H01L 27/14609* (2013.01); *H01L 27/14612* (2013.01);
(Continued)

(58) Field of Classification Search
CPC .... H04N 5/361; H04N 5/3742; H04N 5/3698; H01L 27/14609; H01L 27/1464; H01L 27/14634; H01L 27/14612
See application file for complete search history.

(56) References Cited

U.S. PATENT DOCUMENTS 7,129,985 B1 * 10/2006 Koizumi ................ H04N 5/335
348/207.99
7,812,301 B2 * 10/2010 Oike .................... H04N 5/3559
250/208.1
(Continued)

FOREIGN PATENT DOCUMENTS

EP  1223623 A2  7/2002
JP  2001-257593 A  9/2001
(Continued)

*Primary Examiner* — Que T Le
*Assistant Examiner* — Jennifer Bennett
(74) *Attorney, Agent, or Firm* — Canon U.S.A., Inc. IP Division

(57) ABSTRACT

Dark current from a transfer transistor is suppressed and power-supply voltage in a second semiconductor substrate is lowered. A solid-state image pickup device includes a pixel array, a plurality of common output lines receiving signals read out from a plurality of pixels, a transfer scanning unit sequentially driving the plurality of transfer transistors, a signal processing unit processing the signals output to the common signal lines, and a level shift unit making amplitude of a pulse supplied to a gate of the transfer transistor larger than amplitude of a pulse supplied to a gate of a transistor constituting the signal processing unit. The pixel array and the level shift unit are arranged on a first semiconductor substrate, whereas the plurality of common output lines and the signal processing unit are arranged on a second semiconductor substrate.

11 Claims, 7 Drawing Sheets

(51) Int. Cl.
*H04N 5/374* (2011.01)
*H04N 5/369* (2011.01)

(52) U.S. Cl.
CPC ..... *H01L 27/14634* (2013.01); *H04N 5/3698* (2013.01); *H04N 5/3742* (2013.01); *H01L 27/1464* (2013.01)

(56) References Cited

U.S. PATENT DOCUMENTS

| | | | | |
|---|---|---|---|---|
| 8,009,213 | B2 * | 8/2011 | Okita | H04N 3/155 |
| | | | | 348/300 |
| 8,854,517 | B2 * | 10/2014 | Honda | H01L 27/14634 |
| | | | | 348/274 |
| 9,338,377 | B2 * | 5/2016 | Itano | H01L 27/14609 |
| 2004/0095495 | A1 * | 5/2004 | Inokuma | H04N 5/2253 |
| | | | | 348/308 |
| 2005/0224841 | A1 * | 10/2005 | Nakamura | H04N 5/3597 |
| | | | | 257/215 |
| 2008/0083939 | A1 | 4/2008 | Guidash | |

FOREIGN PATENT DOCUMENTS

| | | |
|---|---|---|
| JP | 2006-314025 A | 11/2006 |
| JP | 2008-160133 A | 7/2008 |
| JP | 2009-170448 A | 7/2009 |
| WO | 2008/156274 A1 | 12/2008 |

\* cited by examiner

[Fig. 1A]
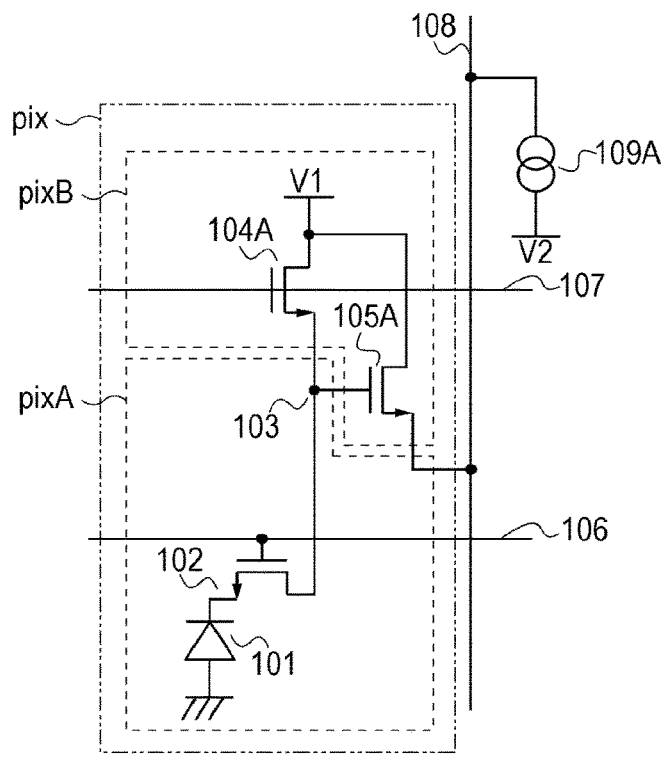
[Fig. 1B]
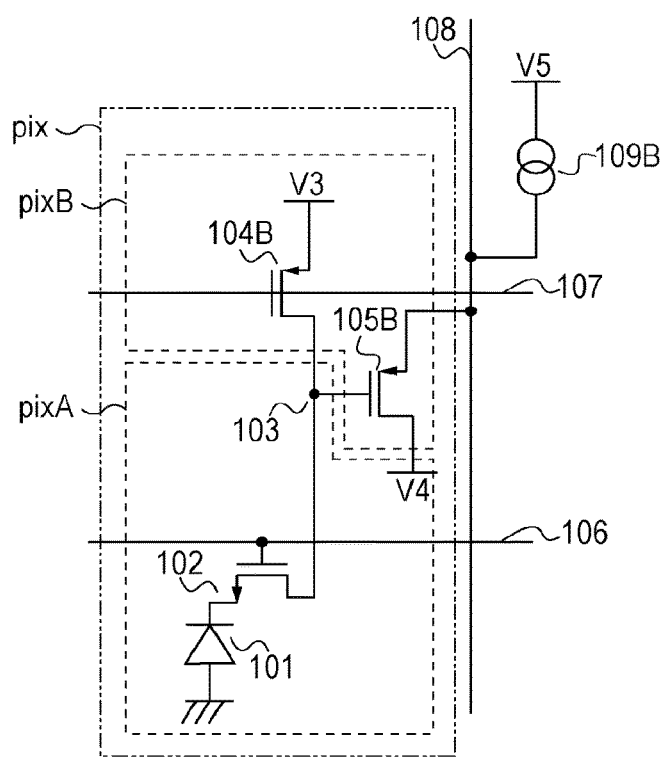

[Fig. 2A]
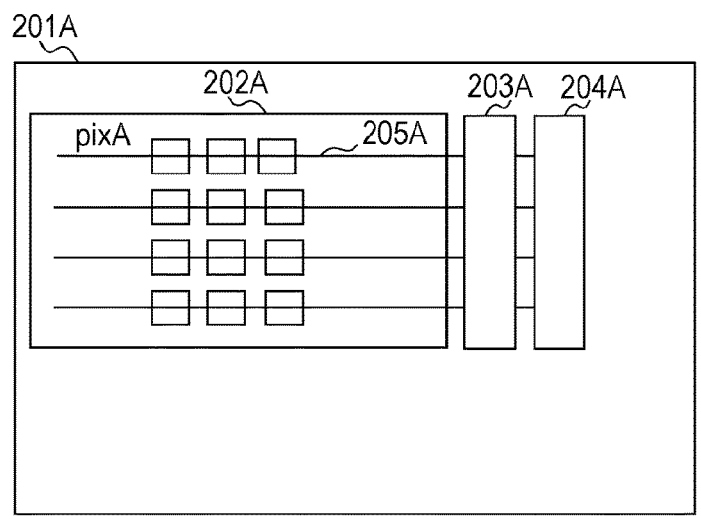
[Fig. 2B]
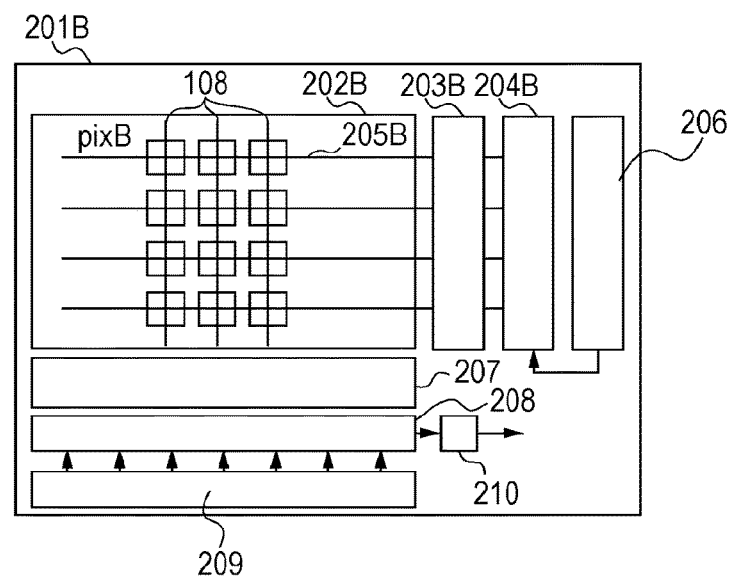

[Fig. 3A]
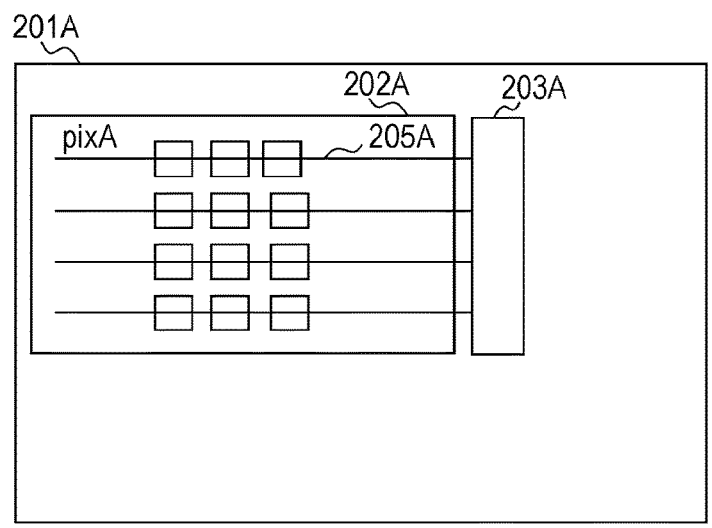
[Fig. 3B]
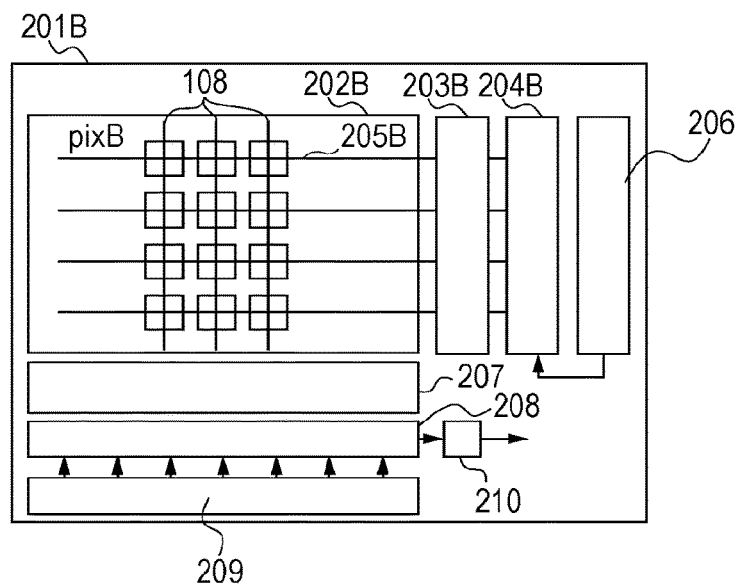

[Fig. 4A]
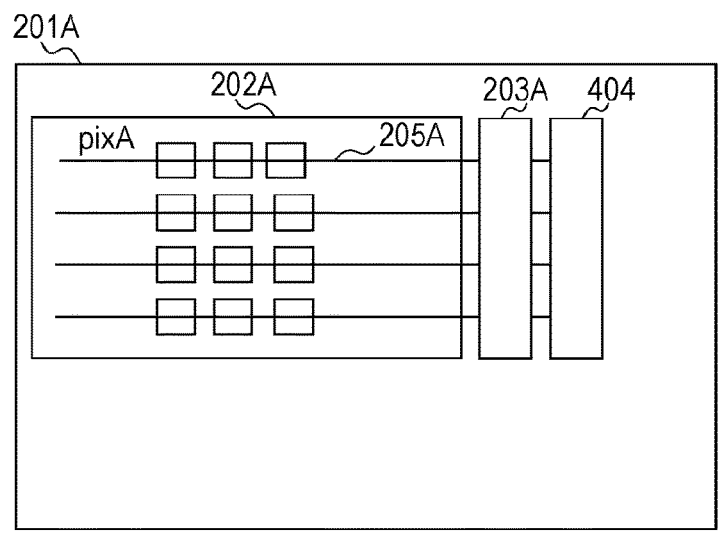
[Fig. 4B]
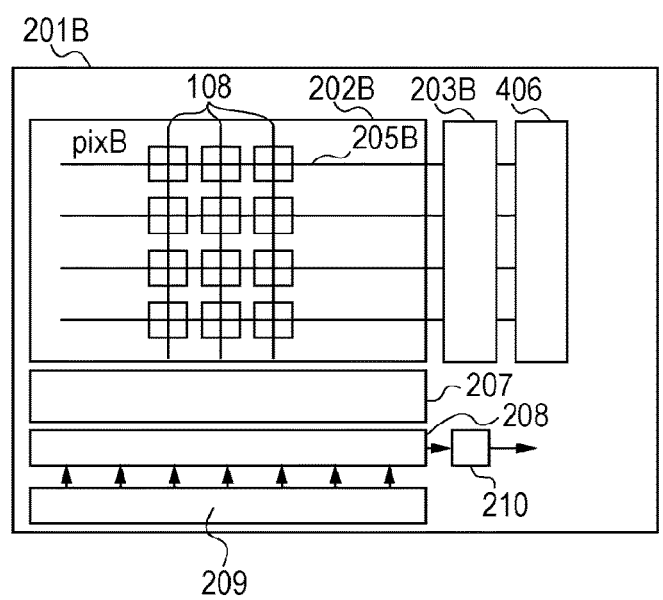

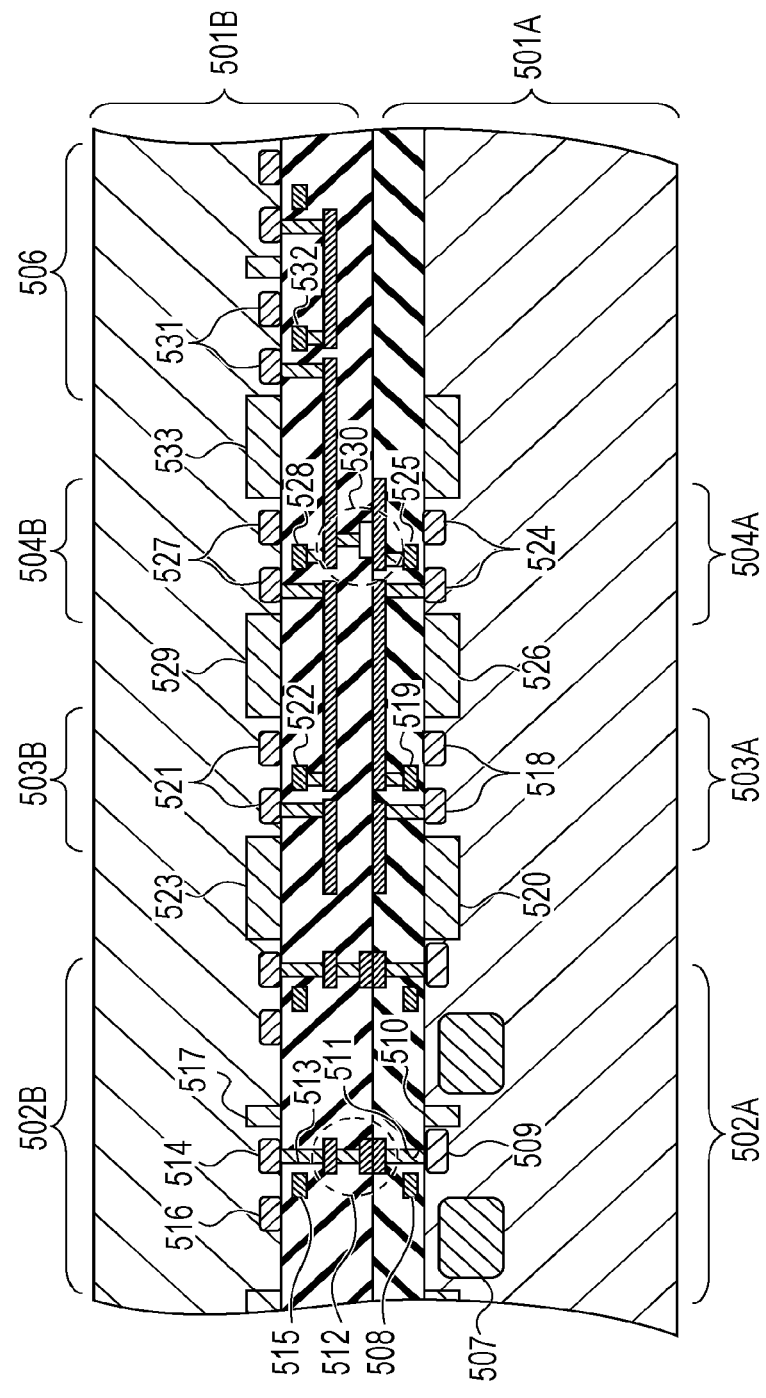
[Fig. 5]

[Fig. 6]
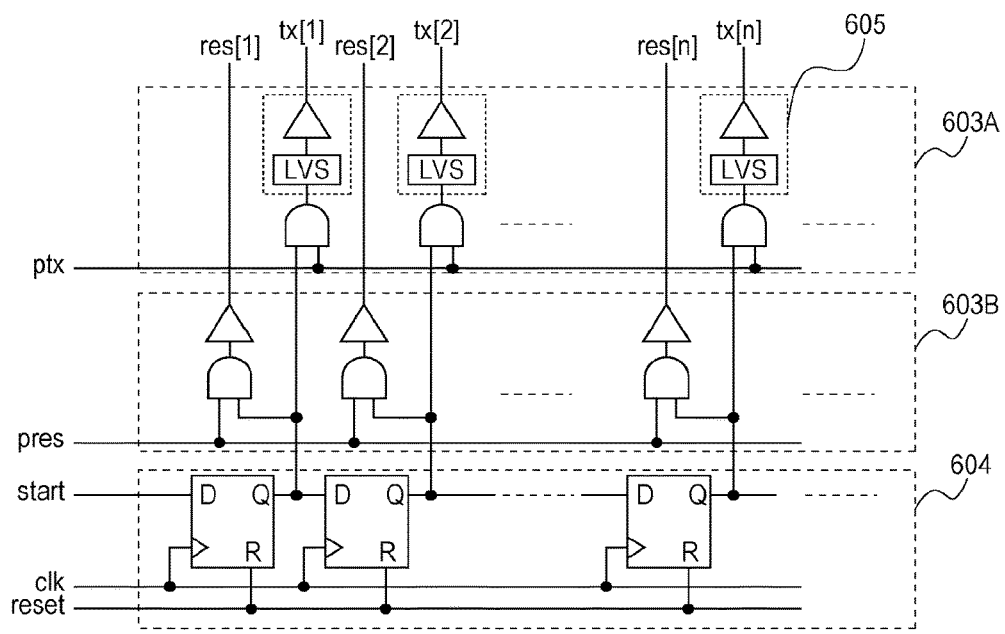

[Fig. 7]
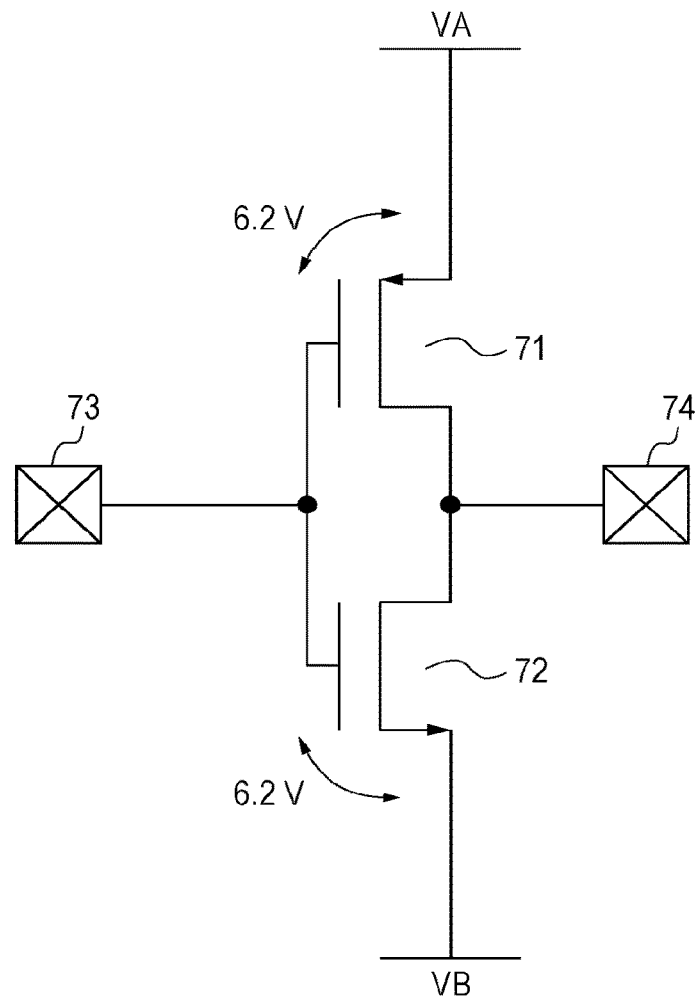

SOLID-STATE IMAGE PICKUP DEVICE WITH SIGNAL PROCESSING AND LEVEL SHIFTING

CROSS-REFERENCE TO RELATED APPLICATION

This application is a Continuation of co-pending U.S. patent application Ser. No. 13/512281 filed May 25, 2012, which is a National Phase Application of International Application PCT/JP2010/006944, filed Nov. 29, 2010, which claims the benefit of Japanese Patent Application No. 2009-274964, filed Dec. 2, 2009. The disclosures of the above-named applications are hereby incorporated by reference herein in their entirety.

TECHNICAL FIELD

The present invention relates generally to solid-state image pickup devices. More particularly, the present invention relates to a solid-state image pickup device including a photoelectric conversion unit and a peripheral circuit unit separately formed on different substrates.

BACKGROUND ART

For solid-state image pickup devices, a configuration is known in which a photoelectric conversion unit and a peripheral circuit unit separately formed on different substrates are electrically connected through a micro bump. Patent Literature 1 discloses the following configuration. A photoelectric conversion unit is arranged on a first semiconductor substrate, whereas a peripheral circuit for reading out a signal from the photoelectric conversion unit, such as a vertical scanning unit and a horizontal scanning unit, is arranged on a second semiconductor substrate. Leakage current is less problematic for transistors arranged on the second semiconductor substrate than for a pixel unit. Accordingly, gate insulating films of the downsized transistors on the second semiconductor substrate are thinned with a CMOS process.

Patent Literature 1 does not fully discuss amplitude of a pulse for driving a transfer transistor that transfers charge generated in the photoelectric conversion unit. The pulse fed to a gate of the transfer transistor may be desired to have larger amplitude than those fed to other transistors in the pixel unit or transistors in the peripheral circuit because of the following reason.

Current leaking from a channel of the transfer transistor during a charge accumulation period of the photoelectric conversion unit may result in dark current. To prevent the dark current, voltage fed to the gate of the transfer transistor during the charge accumulation period can be set to be lower (higher regarding a PMOS transistor) than off-voltage of the other transistors. Accordingly, a range of the voltage fed to the gate of the transfer transistor is wider than that of the voltage fed to the other transistors in the pixel unit and the transistors in the peripheral circuit.

However, Patent Literature 1 does not disclose a circuit for making the amplitude of the pulse fed to the transfer transistor larger than that of the pulses fed to the other transistors and, thus, does not discuss where to arrange such a circuit. Depending on the arrangement, realization of low power-supply voltage is disturbed.

In view of the foregoing problem, the present invention suppresses dark current from the transfer transistor and lowers power-supply voltage in a second semiconductor substrate at the same time.

CITATION LIST

Patent Literature

[PTL 1]
Japanese Patent Laid-Open No. 2009-170448

SUMMARY OF INVENTION

In view of the foregoing problem, a solid-state image pickup device includes: a pixel array including a plurality of pixels each of which includes a photoelectric conversion unit and a transfer transistor configured to transfer charge generated in the photoelectric conversion unit; a plurality of common output lines configured to receive signals from the plurality of pixels included in the pixel array; a transfer scanning unit configured to sequentially drive the plurality of transfer transistors; a signal processing unit configured to process the signals output to the common signal lines; and a level shift unit configured to make amplitude of a pulse supplied to a gate of the transfer transistor larger than amplitude of a pulse supplied to a gate of a transistor constituting the signal processing unit. The pixel array and the level shift unit are arranged on a first semiconductor substrate, whereas the plurality of common output lines and the signal processing unit are arranged on a second semiconductor substrate.

BRIEF DESCRIPTION OF DRAWINGS

FIGS. 1A and 1B are diagrams illustrating examples of an equivalent circuit of a pixel in accordance with an exemplary embodiment of the present invention.

FIGS. 2A and 2B are plan views of a solid-state image pickup device in accordance with a first exemplary embodiment of the present invention.

FIG. 3A and 3B are plan views of a solid-state image pickup device in accordance with a second exemplary embodiment of the present invention.

FIGS. 4A and 4B are plan views of a solid-state image pickup device in accordance with a third exemplary embodiment of the present invention.

FIG. 5 is a sectional view for illustrating an electric connection in the solid-state image pickup device in accordance with the first exemplary embodiment of the present invention.

FIG. 6 is a diagram illustrating an example of an equivalent circuit of a solid-state image pickup device in accordance with an exemplary embodiment of the present invention.

FIG. 7 is a diagram of an example of an equivalent circuit of a level shift unit in accordance with an exemplary embodiment of the present invention.

DESCRIPTION OF EMBODIMENTS

A description will now be given for a configuration of a pixel included in a solid-state image pickup device in accordance with an exemplary embodiment of the present invention.

FIGS. 1A and 1B are diagrams each illustrating an equivalent circuit of a pixel "pix" in accordance with an exemplary embodiment of the present invention. Although FIGS. 1A and 1B illustrate one pixel, a plurality of pixels constitute a pixel array in fact.

Holes and electrons result from photoelectric conversion by a photoelectric conversion unit 101. For example, a photodiode serves as the photoelectric conversion unit 101.

A transfer unit 102, such as a MOS transistor (i.e., a transfer MOS transistor), transfers the charge generated in the photoelectric conversion unit 101.

A node 103 serves as a floating unit for signal readout. Potential of the floating unit shifts into a floating state when the transfer unit 102 transfers the charge of the photoelectric conversion unit 101 thereto. The floating unit 103 includes, for example, a floating diffusion (hereinafter, abbreviated as an FD). The FD is arranged on a first semiconductor substrate.

A reset unit 104, such as a MOS transistor (i.e., a reset MOS transistor), sets at least the potential of the floating unit 103 to reference potential. The reset unit 104 turns on at the same time with the transfer unit 102 to set potential of the photoelectric conversion unit 101 to the reference potential.

An amplifying unit 105 amplifies a signal based on one of the charge pair generated in the photoelectric conversion unit 101 and outputs the amplified signal. For example, a MOS transistor is used as the amplifying unit 105. In such a case, a gate of the MOS transistor serving as the amplifying unit 105 (i.e., an amplifying MOS transistor) is electrically connected to the FD.

A transfer control line 106 is for controlling an operation of the transfer unit 102. A reset control line 107 is for controlling an operation of the reset unit 104. When MOS transistors constitute the transfer unit 102 and the reset unit 104, the transfer control line 106 and the reset control line 107 supply gates of the MOS transistors with pulses for turning on and off the MOS transistors, respectively.

The signal amplified by the amplifying unit 105 is output to a common output line 108. That is, signals are read out to the common output line 108 from the plurality of pixels included in the pixel array.

A constant-current source 109 supplies bias current to the amplifying unit 105. In this circuit configuration, the constant-current source 109 supplies the bias current to the amplifying MOS transistor so that the amplifying MOS transistor operates as a source follower.

Referring to FIG. 1A, a voltage V1 is supplied to drains of the amplifying MOS transistor 105A and the reset MOS transistor 104A. Although the voltage is commonly supplied here, the voltage may be supplied from different power supplies. A voltage V2 is supplied to the constant-current source 109A illustrated in FIG. 1A.

Referring to FIG. 1B, a voltage V3 is supplied to a drain of the reset MOS transistor 104B, whereas a voltage V4 is supplied to a drain of the amplifying MOS transistor 105B. A voltage V5 is supplied to the constant-current source 109B illustrated in FIG. 1B.

A dotted line pixA indicates the pixel-constituting units arranged on the first semiconductor substrate, whereas a dotted line pixB indicates those arranged on a second semiconductor substrate. The elements enclosed by the dotted lines pixA and pixB constitute the pixel pix.

Differences between FIG. 1A and FIG. 1B will now be described. Different elements are distinguished from one another by attaching characters "a" and "b" to reference characters. More specifically, each of the amplifying MOS transistor and the reset MOS transistor has a different conductivity type. N-channel metal-oxide semiconductor (NMOS) transistors are used in FIG. 1A, whereas p-channel MOS (PMOS) transistors are used in FIG. 1B. To cope with the different conductivity type, the voltages supplied to the respective transistors and the constant-current source also differ.

Referring to FIG. 1A, the voltage V1 corresponds to a power-supply voltage, such as 5 V or 3.3 V. The voltage V2, such as ground potential, is lower than the power-supply voltage V1. Referring to FIG. 1B, the voltages V3 and V4, such as the ground potential, are relatively low, whereas the voltage V5, such as 3.3 V or 1.8 V, is higher than the voltage V3.

In FIG. 1B, a PMOS transistor serves as the amplifying MOS transistor. The photoelectric conversion unit 101 uses electrons as signal charge. A sufficiently large amount of incident light causes gate potential of the PMOS transistor to drop. In response to the gate potential drop, source potential of the PMOS transistor changes in a rising direction compared with that in a dark state. That is, the common output line 108 can be driven with a high driving power when signal amplitude is larger than that in a reset state. Thus, the configuration in FIG. 1B has more advantages readout speed than the configuration in FIG. 1A. In the related art, since such a configuration is arranged on a single semiconductor substrate, a structure of the resulting pixel unfortunately complicates because of use of different wells in the pixel. In contrast, such a configuration is separately arranged on different substrates in an exemplary embodiment of the present invention, whereby the disadvantage of the complex structure can be overcome. Furthermore, the configuration in FIG. 1B can have a narrower operating-voltage range and is advantageous from a standpoint of realization of low power-supply voltage.

What is important here is not the use of the PMOS transistor serving as the amplifying MOS transistor but is the use of a MOS transistor having a polarity opposite to that of the signal charge. More specifically, PMOS transistors are used as the amplifying MOS transistor and the reset MOS transistor when electrons serve as the signal charge, whereas NMOS transistors are used when holes serve as the signal charge. That is, when the transfer MOS transistor has a first conductivity type, the amplifying MOS transistor and the reset MOS transistor have a second conductivity type opposite to the first one.

Although the configuration of the pixel has been described above, the configuration of the pixel is not limited to the described one. For example, a junction field effect transistor (JFET) may be used as the amplifying transistor. Additionally, the photoelectric conversion unit 101 may use holes as the signal charge. In such a case, a PMOS transistor is used as the transfer transistor. In addition, a plurality of photoelectric conversion units may share the amplifying transistor and the reset transistor. A select transistor connected to the amplifying transistor in series may be additionally used. The elements of the pixel are not necessarily separately arranged on the plurality of semiconductor substrates in accordance with the example configuration described above. In addition to the foregoing example, the reset MOS transistor and the amplifying MOS transistor may be arranged on the first semiconductor substrate. However, the common output line 108 can be arranged in the second semiconductor substrate. Furthermore, the amplifying MOS transistor and the reset MOS transistor may be omitted from the pixel and the transfer MOS transistor may output the charge generated in the photoelectric conversion unit 101 directly to the common output line 108.

Features of the present invention will now be described below through exemplary embodiments. In an example described below, MOS transistors are used as the transfer unit 102, the reset unit 104, and the amplifying unit 105 and electrons serve as the signal charge. When holes are used as the signal charge, a conductivity type of each pixel semiconductor region arranged on the first semiconductor substrate may be at least reversed.

[First Embodiment]

In a first exemplary embodiment, a photoelectric conversion unit, a transfer MOS transistor, and an FD constituting each pixel are arranged on a first semiconductor substrate. Furthermore, a transfer scanning unit for sequentially driving the transfer MOS transistors and a transfer buffer unit for buffering a driving signal from the transfer scanning unit are arranged on the first semiconductor substrate. The transfer buffer unit is arranged in a path between gates of the transfer MOS transistors and the transfer scanning unit. The transfer buffer unit includes a level shift unit therein. The level shift unit has a function for making amplitude of a pulse supplied to the gate of the transfer MOS transistor larger than amplitude of a pulse supplied to a gate of a transistor constituting at least one of a reset scanning unit and a signal processing unit arranged on a second semiconductor substrate.

A reset MOS transistor and an amplifying MOS transistor constituting each pixel are arranged on the second semiconductor substrate. Furthermore, the reset scanning unit for driving the reset MOS transistors and a reset buffer unit for buffering a driving signal from the reset scanning unit are arranged on the second semiconductor substrate. The reset buffer unit is arranged in a path between gates of the reset MOS transistors and the reset scanning unit. Moreover, a timing generator for supplying a clock pulse to each scanning unit and the signal processing unit for processing signals output to a common output line are arranged on the second semiconductor substrate.

FIGS. 2A and 2B illustrate a specific layout example on semiconductor substrates in accordance with the first exemplary embodiment.

More specifically, FIG. 2A illustrates a layout on a first semiconductor substrate 201A, whereas FIG. 2B illustrates a layout on a second semiconductor substrate 201B. A positional relationship between the arranged first and second semiconductor substrates generally matches the one illustrated in FIGS. 2A and 2B.

A pixel array portions 202A and 202B collectively indicate a pixel array. The pixel array portion 202A includes a photoelectric conversion unit, a transfer MOS transistor, and an FD of elements constituting each pixel, whereas the pixel array portion 202B includes a reset MOS transistor and an amplifying MOS transistor of the elements constituting each pixel.

A transfer buffer unit 203A, a reset buffer unit 203B, a transfer scanning unit 204A, and a reset scanning unit 204B are also illustrated. The transfer scanning unit 204A and the reset scanning unit 204B supply driving pulses to the pixels in the pixel array. More specifically, each of the transfer scanning unit 204A and the reset scanning unit 204B includes a shift register and an address decoder and desirably has at least a function for sequentially selecting a plurality of pixels in the pixel array. The pulses output from the transfer scanning unit 204A and the reset scanning unit 204B undergo impedance conversion in the transfer buffer unit 203A and the reset buffer unit 203B, respectively, before being supplied to the pixels.

A transfer control line 205A carries the driving pulse output from the transfer buffer unit 203A, whereas a reset control line 205B carries the driving pulse output from the reset buffer unit 203B.

A timing generator 206 is capable of supplying a clock signal to each scanning unit and each buffer unit.

A signal processing unit 207 is, for example, a circuit capable of processing signals from a plurality of pixels in parallel. More specifically, the signal processing unit 207 includes an amplifier, a correlated double sampling (CDS) circuit, and an analog/digital converter provided for each pixel column. The signal processing unit 207 includes a plurality of transistors each functioning as a switch or part of an operational amplifier.

The signal processing unit 207 processes the signals in parallel to convert the signals into a serial signal. The serial signal is read out to outside through a horizontal output line 208.

A horizontal scanning unit 209 sequentially supplies a pulse so that the signals processed by the signal processing unit 207 are converted into the serial signal. Just like the scanning units, the horizontal scanning unit 209 desirably has at least a function for sequentially selecting one of the signals processed by the signal processing unit 207 in parallel.

An amplifying unit 210 amplifies the signal output from the horizontal output line 208 and outputs the amplified signal to outside. The amplifying unit 210 is provided as needed.

The FD arranged on the first semiconductor substrate 201A is electrically connected to a gate of the amplifying MOS transistor arranged on the second semiconductor substrate 201B. Additionally, the transfer scanning unit 204A is connected to the timing generator 206 to be able to receive the clock pulse from the timing generator 206.

FIG. 5 illustrates a sectional view for describing an electrical connection between a first semiconductor substrate and a second semiconductor substrate.

A first semiconductor substrate 501A includes a transfer buffer unit 503A and a transfer scanning unit 504A, whereas a second semiconductor substrate 501B includes a reset buffer unit 503B and a reset scanning unit 504B. A timing generator 506 generates a timing signal for controlling operations of the transfer scanning unit 504A and the reset scanning unit 504B. An n-type semiconductor region 507 is capable of storing electrons generated in a photoelectric conversion unit. The photoelectric conversion unit including the n-type semiconductor region 507 constitutes, for example, a pinned photodiode.

A gate electrode 508 is arranged over the first semiconductor substrate 501A through an insulating film. In accordance with a supplied pulse, the gate electrode 508 transfers the charge accumulated in the n-type semiconductor region 507 to an FD 509 formed of an n-type semiconductor region. The FD 509 receives the electrons generated in and transferred from the photoelectric conversion unit.

Element isolation regions 510, 517, 520, 523, 526, 529, and 533 isolate adjacent elements from one another to prevent a channel between the adjacent elements.

A contact plug 511 is electrically connected to the FD 509. The contact plug 511 is formed by filling a contact hole on the FD 509 with a conductive material.

An electrical contact 512 electrically connects the first semiconductor substrate 501A to the second semiconductor substrate 501B. More specifically, the electrical contact 512 electrically connects the FD 509 arranged on the first semiconductor substrate 501A to a source of a reset MOS transistor arranged on the second semiconductor substrate 501B. A contact plug 513 is formed by filling a contact hole on a source region 514 of the reset MOS transistor with a conductive material.

The source region 514 of the reset MOS transistor is formed of an n-type semiconductor region in the equivalent circuit of the pixel illustrated in FIG. 1A, whereas the source region 514 is formed of a p-type semiconductor region in the equivalent circuit of the pixel illustrated in FIG. 1B. A gate electrode 515 is arranged over the second semiconductor substrate 501B through an insulating film. The gate electrode 515 controls conduction of the reset MOS transistor in accordance with a supplied pulse. A predetermined voltage is supplied to a drain region 516 of the reset MOS transistor to turn on the reset MOS transistor, so that the charge of the FD 509 is emitted. Furthermore, the transfer MOS transistor may be turned on at the same time with the reset MOS transistor, so that the charge of the n-type semiconductor region 507 is also emitted.

A MOS transistor constituting the transfer buffer unit 503A has source and drain regions 518 and a gate electrode 519. Although FIG. 5 illustrates an NMOS transistor having the same conductivity type as the pixel unit, a PMOS transistor on an n-type well may be further included.

A MOS transistor constituting the reset buffer unit 503B has source and drain regions 521 and a gate electrode 522. Just like the transfer buffer unit 503A, the reset buffer unit 503B may further include a MOS transistor having the opposite conductivity type.

A MOS transistor constituting the transfer scanning unit 504A has source and drain regions 524 and a gate electrode 525. Just like the buffer units, the transfer scanning unit 504A may further include a MOS transistor having the opposite conductivity type.

A MOS transistor constituting the reset scanning unit 504B has source and drain regions 527 and a gate electrode 528. Just like the transfer scanning unit 504A, the reset scanning unit 504B may further include a MOS transistor having the opposite conductivity type.

An electrical contact 530 electrically connects the timing generator 506 to the transfer scanning unit 504A and the reset scanning unit 504B.

A MOS transistor constituting the timing generator 506 has source and drain regions 531 and a gate electrode 532. Just like the above-described members, the timing generator 506 may further include a MOS transistor having the opposite conductivity type.

Although FIG. 5 omits illustration of the amplifying MOS transistor, the amplifying MOS transistor may be provided for each photoelectric conversion unit or each plurality of photoelectric conversion units. In this case, the amplifying MOS transistor is arranged on the second semiconductor substrate 501B. A gate of the amplifying MOS transistor is connected to the electrical contact 512.

FIG. 6 illustrates a block diagram of a transfer scanning unit, a reset transfer unit, a transfer buffer unit, and a reset buffer unit. Although the transfer scanning unit and the reset scanning unit are collectively illustrated as a single circuitry, the transfer scanning unit and the reset scanning unit are separately arranged on first and second semiconductor substrates, respectively.

The transistors constituting the scanning units and the buffer units illustrated in FIG. 5 constitute part of the circuitry illustrated in FIG. 6.

A transfer buffer unit 603A includes an AND circuit and a level shift unit 605 for changing amplitude of a pulse from the transfer scanning unit. A signal "ptx" is input to an input terminal of the AND circuit, whereas the pulse from the transfer scanning unit is input to another input terminal thereof. The AND circuit determines a logical AND of the input signals and supplies a resulting driving pulse to a gate of a transfer MOS transistor.

A reset buffer unit 603B includes an AND circuit. A signal "pres" is input to an input terminal of the AND circuit, whereas the pulse from the reset scanning unit is input to another input terminal thereof. The AND circuit determines a logical AND of the input signals and supplies a resulting driving pulse to a gate of a reset MOS transistor.

The signals "ptx" and "pres" may be supplied to the first and second semiconductor substrates, respectively, directly from outside or through the timing generator.

Each of the scanning units 604 is constituted by a shift register including a D flip-flop. The scanning units 604 operate in accordance with pulses "start", "clk", and "reset" supplied from the timing generator.

The level shift unit 605 will now be described. FIG. 7 illustrates an equivalent circuit thereof.

The level shift unit 605 includes a PMOS transistor 71 and an NMOS transistor 72. The PMOS transistor 71 has a drain connected to a gate of the transfer MOS transistor through an output node 74 and the transfer control line and a source supplied with a voltage VA of, for example, 5V. The NMOS transistor 72 has a drain connected to the gate of the transfer MOS transistor through the output node 74 and the transfer control line and a source supplied with a reference voltage VB. A sign of the reference voltage VB is opposite to that of the voltage VA. More specifically, the reference voltage VB may be, for example, −1.2 V. The drain of the PMOS transistor 71 is connected to the drain of the NMOS transistor 72. Gates of the PMOS transistor 71 and the NMOS transistor 72 are connected to an input node 73. The input node 73 is supplied with a pulse having amplitude smaller than a result of VA-VB.

A case where the PMOS transistor 71 is turned off will now be discussed. A difference voltage Vgs71 between the voltage VA and the reference voltage VB is generated between the gate and the source of the PMOS transistor 71. For example, when the voltage VA and the reference voltage VB are equal to 5 V and −1.2 V, respectively, $$Vgs71 = 5\ V - (-1.2V) = 6.2\ V \qquad \text{Equation 1}$$

is generated. That is, the voltage of 6.2 V is applied to the gate insulating film.

Since the voltage higher than that applied to transistors operating between the power-supply voltage and the ground potential is applied to the gate insulating film, the PMOS transistor 71 desirably have a configuration, such as a thick gate insulting film, different from the MOS transistors on the second semiconductor substrate.

Similarly, since the voltages of 5V and −1.2 V are applied to the gate of the transfer MOS transistor at the time of ON and OFF, respectively, a voltage of 6.2 V is applied to the gate insulting film of the transfer MOS transistor. Accordingly, the transfer MOS transistor desirably has the different configuration based on the same reason as that for the MOS transistor of the transfer buffer unit.

When the buffer unit is arranged on the second semiconductor substrate, a widest range of voltage supplied to the transistor of the buffer unit controls thickness of the gate insulating film. Accordingly, the gate insulting film of each MOS transistor arranged on the second semiconductor substrate has the thickness similar to that of the gate insulting film of the MOS transistor arranged on the first semiconductor substrate. Such a configuration makes it difficult to realize an operation at low voltage.

Collectively arranging the transfer MOS transistor and the MOS transistor of the transfer buffer unit on the first semiconductor substrate permits the second semiconductor substrate to include only the MOS transistors intended for voltage lower than that of the first semiconductor substrate. By arranging the buffer unit on the first semiconductor substrate, the transistors having a wide supplied voltage range can be collected in the first semiconductor substrate and, thus, the gate insulting films of the transistors on the second semiconductor substrate can be thinned. That is, every transistor arranged on the second semiconductor substrate can be set to operate at low power-supply voltage. More specifically, when the circuit illustrated in FIG. 1A is used, an operating voltage range for the first semiconductor substrate is equal to 6.2 V, whereas that for the second semiconductor substrate can be set equal to 5 V or 3.3 V (=V1-V2).

Furthermore, when the circuit illustrated in FIG. 1B is used, the range of the voltage supplied to the MOS transistors on the second semiconductor substrate can be further narrowed. More specifically, use of PMOS transistors serving as the reset MOS transistor and the amplifying MOS transistor can further narrow the voltage range. The range of the voltage supplied to the gate of the transfer MOS transistor is 6.2 V (Vtx is more than or equal to −1.2 V and less than or equal to 5 V). In contrast, the range of the voltage supplied to the gate of the reset MOS transistor can be narrowed to 1.7 V (Vres is more than or equal to 3.3 V and less than or equal to 5 V).

The configuration according to the first exemplary embodiment can suppress leakage of charge to the photoelectric conversion unit from the channel of the transfer transistor and can lower power-supply voltage in the second semiconductor substrate.

[Second Embodiment]

A second exemplary embodiment differs from the first one in that a transfer scanning unit is arranged on the second semiconductor substrate. Other than this point, the second exemplary embodiment is similar to the first one. FIGS. 3A and 3B illustrates layouts of elements on respective semiconductor substrates. Like reference characters are attached to parts having similar functions as those described in the first exemplary embodiment to omit a detailed description thereof.

As described in the first exemplary embodiment, the transfer scanning unit is desirably capable of at least sequentially outputting a driving pulse and does not have to supply voltage of a wide range. Accordingly, integrating the transfer scanning unit and a reset scanning unit into a single scanning unit 204B and arranging the common scanning unit 204B on the second semiconductor substrate can reduce a circuit area and increase an area of a photoelectric conversion unit.

FIGS. 4A and 4B illustrate an alteration of this exemplary embodiment. The common scanning unit is arranged on the second semiconductor substrate in FIGS. 3A and 3B, whereas a common scanning unit 404 may be arranged on the first semiconductor substrate as illustrated in FIGS. 4A and 4B.

Although specific exemplary embodiments of the present invention have been described above, the present invention should not be limited to these exemplary embodiments and can be modified without departing from the spirit of the present invention.

In the exemplary embodiments, the case has been described in which the voltage supplied to the gate of the transfer MOS transistor during an OFF period is lower than the off-period voltage supplied to other MOS transistors. However, the present invention can be applied as long as the voltage supplied to the gate of the transfer MOS transistor during an ON period is higher than the on-period voltage supplied to the other MOS transistor.

Although the photoelectric conversion unit, the transfer MOS transistor, and the FD of the pixel are arranged on the first semiconductor substrate, the pixel configuration is not limited to this example. At least one of the amplifying MOS transistor and the reset MOS transistor may be arranged on the first semiconductor substrate. Furthermore, when the pixel further includes a select MOS transistor, the select MOS transistor may also be arranged on the first semiconductor substrate.

The description has been given for the configuration in which the level shift unit is included in the transfer buffer unit arranged between the transfer scanning circuit and the gate of the transfer MOS transistor. However, the configuration of the level shift unit is not limited to this example. The transfer scanning unit may use a circuit for large pulse amplitude. In such a case, the transfer scanning unit includes the level shift unit.

The level shift unit desirably has at least a function of making the voltage range of the pulse supplied to the gate of the transfer transistor wider than the voltage range of the pulse supplied to the gates of the transistors constituting at least one of the reset scanning unit and the signal processing unit arranged on the second semiconductor substrate.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

REFERENCE SIGNS LIST

101 Photoelectric conversion unit
102 Transfer transistor
108 Common output line
204A Transfer scanning unit
207 Signal processing unit
605 Level shift unit

The invention claimed is:

1. A solid-state image pickup device, comprising:
a pixel array including a plurality of pixels, each of the plurality of pixels including a photoelectric conversion unit and a transfer transistor configured to transfer charge generated in the photoelectric conversion unit;
a signal processing unit configured to process signals output from the pixels; and
a level shift unit configured to supply a pulse to a gate of the transfer transistor,
wherein amplitude of the pulse supplied to the gate of the transfer transistor is larger than amplitude of a pulse supplied to a gate of a transistor that constitutes the signal processing unit,
wherein the pixel array and the level shift unit are arranged on a first semiconductor substrate, whereas the signal processing unit is arranged on a second semiconductor substrate stacked on the first semiconductor substrate, and
wherein a gate insulating film of a transistor that constitutes the level shift unit is thicker than a gate insulating film of a transistor that constitutes the signal processing unit.

2. The solid-state image pickup device according to claim 1, wherein the pixel further includes an amplifying transistor configured to amplify a signal based on the charge generated in the photoelectric conversion unit.

3. The solid-state image pickup device according to claim 2, wherein the amplifying transistor arranged at the second semiconductor substrate.

4. The solid-state image pickup device according to claim 2, wherein the amplifying transistor arranged at the first semiconductor substrate.

5. The solid-state image pickup device according to claim 1, further comprising:
a transfer scanning unit, and
a transfer buffer unit in a path between the transfer transistors and the transfer scanning unit, the transfer buffer unit buffering a signal from the transfer scanning unit and including the level shift unit.

6. The solid-state image pickup device according to claim 1, each of the plurality of pixels further including a reset unit, the solid-state image pickup device further comprising:
a reset scanning unit configured to sequentially drive the plurality of reset units; and
a reset buffer unit in a path between the reset units and the reset scanning unit, the reset buffer unit buffering a signal from the reset scanning unit.

7. The solid-state image pickup device according to claim 5, each of the plurality of pixels further including a reset unit, the solid-state image pickup device further comprising:
a reset scanning unit configured to sequentially drive the plurality of reset units, and wherein the transfer scanning unit and the reset scanning unit are arranged at the second semiconductor substrate.

8. The solid-state image pickup device according to claim 2,
wherein each of the plurality of pixels includes a reset transistor, and
wherein the transfer transistor is a MOS transistor having a first conductivity type, the reset transistor is a MOS transistor having a second conductivity type, and the amplifying unit includes a source follower constituted by a transistor having the second conductivity type.

9. The solid-state image pickup device according to claim 5, further comprising a timing generator configured to supply a clock signal to the transfer scanning circuit, which is arranged at the second semiconductor substrate.

10. The solid-state image pickup device according to claim 9, wherein the signal processing unit comprises analog digital converters.

11. The solid-state image pickup device according to claim 10, wherein a common output line is provided on the second semiconductor substrate, and a plurality of signals processed in parallel, at the analog digital converters, is converted into a serial signal to be output to the common output line.

* * * * *